April 26, 1960 R. D. HUNTOON 2,934,712

GAIN CONTROL CIRCUIT

Filed June 26, 1945 2 Sheets-Sheet 1

INVENTOR
ROBERT D. HUNTOON
BY Ralph L. Chappell
ATTORNEY

GAIN CONTROL CIRCUIT

Filed June 26, 1945 2 Sheets-Sheet 2

INVENTOR
ROBERT D. HUNTOON
BY [signature]
ATTORNEY

United States Patent Office 2,934,712

Patented Apr. 26, 1960

2,934,712

GAIN CONTROL CIRCUIT

Robert D. Huntoon, Silver Spring, Md., assignor to the United States of America as represented by the Secretary of the Navy Application June 26, 1945, Serial No. 601,680

1 Claim. (Cl. 330—101)

(Granted under Title 35, U.S. Code (1952), sec. 266)

This invention relates to installations on the walls of ticularly to an improved method of and means for controlling the gain of such amplifiers.

An important object of the invention is to provide such a gain control means which is compact, sensitive, accurate and stable and which affords wide adjustment of amplifier gain. A related object is to provide such a control means which requires no apparatus other than a very small variable capacitor and which is therefore suitable for use in amplifying systems of relatively small physical dimensions.

A further object of the invention is to provide a gain control means which does not substantially affect the frequency response of the amplifier and which facilitates adjustment of the amplifier to any desired predetermined gain, offering a simple expedient whereby a plurality of amplifiers may be compared to a standard and so adjusted as to conform to a specified output signal characteristic without the necessity of close tolerances in the individual components thereof.

Other objects will be apparent upon consideration of this disclosure in its entirety. In the drawings.

Figure 1:
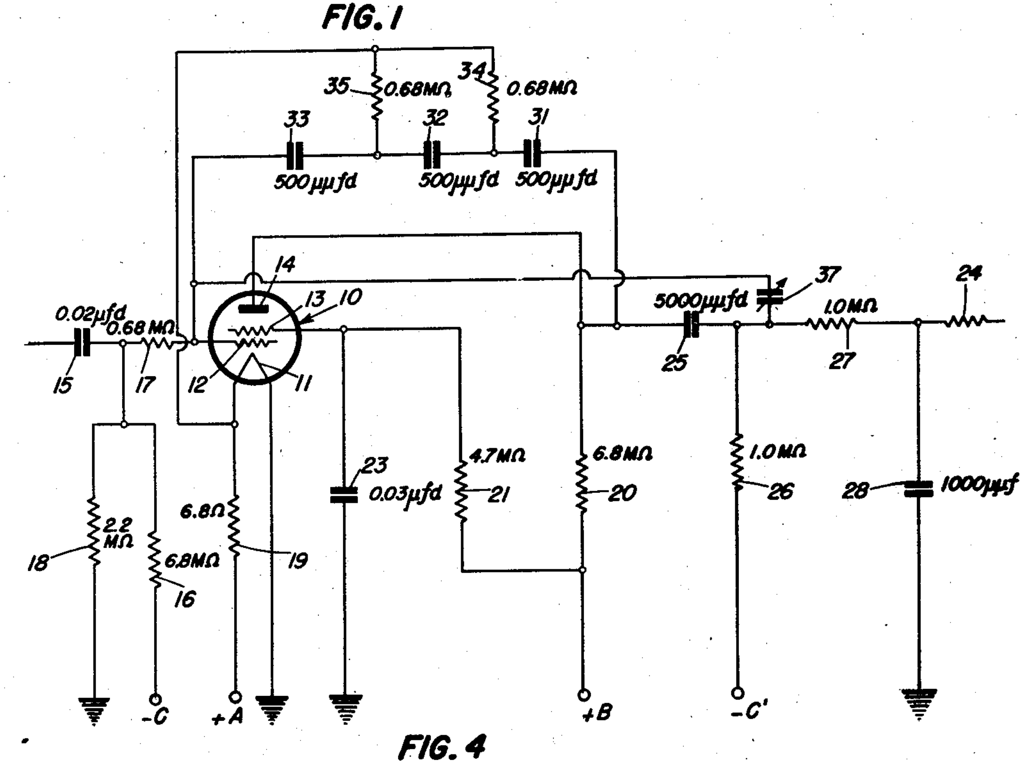
Fig. 1 is a circuit schematic of an amplifier incorporating an improved and simplified gain control circuit in accordance with the invention.

Referring now particularly to Fig. 1 of the drawings, there is illustrated a complete electronic amplifier of the type employed to amplify a relatively weak input signal and to apply an amplified output signal to an electronic relay, together with its associated input signal coupling circuit and output signal coupling circuit to the electronic relay. The amplifier comprises an electronic tube of the pentode type indicated generally at 10, having a conventional filament 11, control grid 12, screen grid 13, and anode 14. An input signal to be amplified is translated to the control grid through a coupling condenser 15 and grid leak resistor 16, and a series resistor 17 connected to the junction of resistor 16 and capacitor 15. The control grid is provided with bias from an appropriate source indicated at —C through a voltage divider network comprising a resistor 18 and resistor 16. The filament is provided with heating current by a source indicated generally at +A and a resistor 19 is serially included in circuit between the positive terminal of this source and the filament. The anode and screen grid are coupled to an appropriate source of space current indicated generally at +B through plate load resistor 20 and screen voltage dropping resistor 21, respectively. A condenser 23 is provided, to by-pass screen 13 for high-frequency voltages. The amplified output signal is translated to the control electrode 24 of a thyratron, included in an electronic relay, by a coupling network comprising a cacapacitor 25, grid leak resistor 26, and series resistor 27 connected to the junction of capacitor 25 and resistor 26. The thyratron is normally biased by an appropriate source coupled to resistor 26 and indicated generally at —C′. Capacitor 28 is connected between grid 24 and the ground. The above-described components and the operation thereof are well known to the art so that further description thereof is deemed unnecessary.

The amplifier includes circuit arrangements for attaining a high response at a predetermined narrow band of frequencies, so as to cause the thyratron tube to be triggered in response to input signals of that frequency, and for so determining the gain of the complete amplifier with its associated coupling network that, for a given input signal magnitude, the output signal applied to the thyratron control electrode may be regulated to conform to a specified standard, permitting a wide variation in the gain or "mu" of the tubes employed.

The Fig. 1 embodiment includes frequency selective gain control means. This means comprises a phase-shifting attenuating network coupled to anode 14 and consisting of series capacitors 31, 32, 33, and shunt resistors 34 and 35, the remote terminal of capacitor 33 being connected to grid 12 and the remote terminal of the resistors being connected to the positive terminal of filament 11. The connection of the resistors to the junction of resistor 19 and the filament produces certain desirable operating characteristics described in the co-pending patent application of Finley L. Cooke, Serial No. 589,442, filed April 20, 1945, entitled "Electron Tube Circuit," now abandoned. The feedback network last described will hereinafter be referred to as the "regenerative feedback path" although at some frequencies it operates as a degenerative feedback network.

Also coupled to the output circuit of tube 10, specifically to the terminal of capacitor 25 remote from tube 10 is a degenerative network comprising a variable gain control capacitor 37 and providing a feedback path to grid 12. This feedback path is hereinafter referred to as the "degenerative feedback path."

Figure 2:
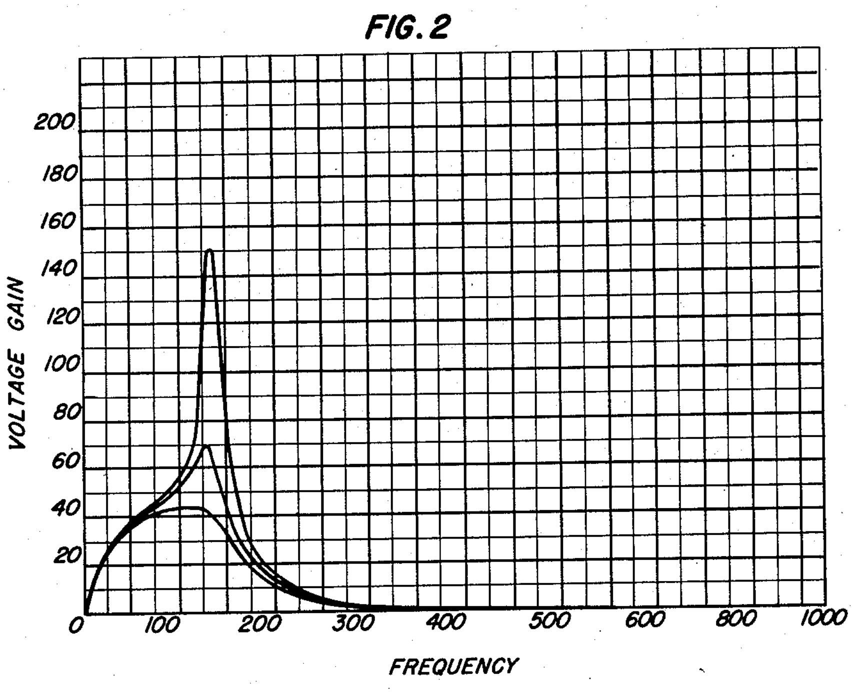
Fig. 2 illustrates a family of three curves showing gain plotted against frequency for three different values of the capacitance of the adjusting condenser included in the gain control of the Fig. 1 embodiment, unidirectional steady filament voltage being employed.

Referring now to Fig. 2 of the drawings, curves showing the variation of voltage gain of the amplifier over a range of frequencies for various capacitance settings of the gain control are illustrated. The amplifier having the circuit parameters indicated in Fig. 1 has a peak frequency response in the vicinity of 125 cycles per second. It will be seen that a change of 50% in the overall gain of the amplifier may conveniently be made by adjustment of the very small condenser 37, so that effective control of the gain of the amplifier system is attained regardless of the gain or "mu" of the tube itself. The curve also shows that the change in gain is accompanied by negligible change of the shape of the response curve, adjustment of capacitor 37 having substantially no tuning effect. At the above-mentioned peak frequency the feedback through the attenuating network is regenerative in character while the feedback through condenser 37 is degenerative. The regenerative and degenerative feedback voltages may be made to oppose one another in varying relative amounts at peak frequency to give the desired ratio of gain to feedback. The required phase shift of 180° exists at this peak frequency, so that the signal feedback voltage from the attenuating network is in phase with the input signal, regeneration serving to increase the gain of the amplifier. Sufficient degenerative feedback to prevent oscillation is supplied. At higher frequencies the phase shift is small and the feedback signal attenuation effected by the regenerative network is less so that a strong out-of-phase signal is fed back to the input, thereby greatly reducing the gain of the amplifier. At frequencies above the peak frequency therefore, the cumulative effect of the voltages fed back through the two paths is a more abrupt high-frequency cut-off than would normally be the case.

At low frequencies the phase shift caused by the regenerative network is greater than 180° so that the effect thereof is to reduce gain. At these low frequencies, however, the attenuation in the regenerative network is so large that the effect of the regenerative feedback is negligible and the low-frequency response of the amplifier, if it depended on that factor alone, would be practically the same as it would be without feedback. Again, at low frequencies, the effects of both feedback paths are cumulative so that they cause a lower response than would normally be the case.

It will be seen that the above-described amplifier is essentially an oscillator with the feedback sufficiently reduced to prevent oscillation yet strong enough to maintain a relatively high Q, the amount of regenerative action being controlled by the degenerative feedback condenser 37, which serves also, as hereinabove explained, to prevent undesired oscillation and to stabilize the amplifier.

The connection of capacitor 37 to the junction of resistors 26 and 27 causes a negative voltage to appear thereacross. Slight leakage does not cause the amplifier to lose bias but actually adds a small bias, with a minor resulting change in gain. In the embodiment illustrated, with condenser leakage approximately 100 megohms the change in bias is of the order of .05 volt at control grid 12.

Figure 4:
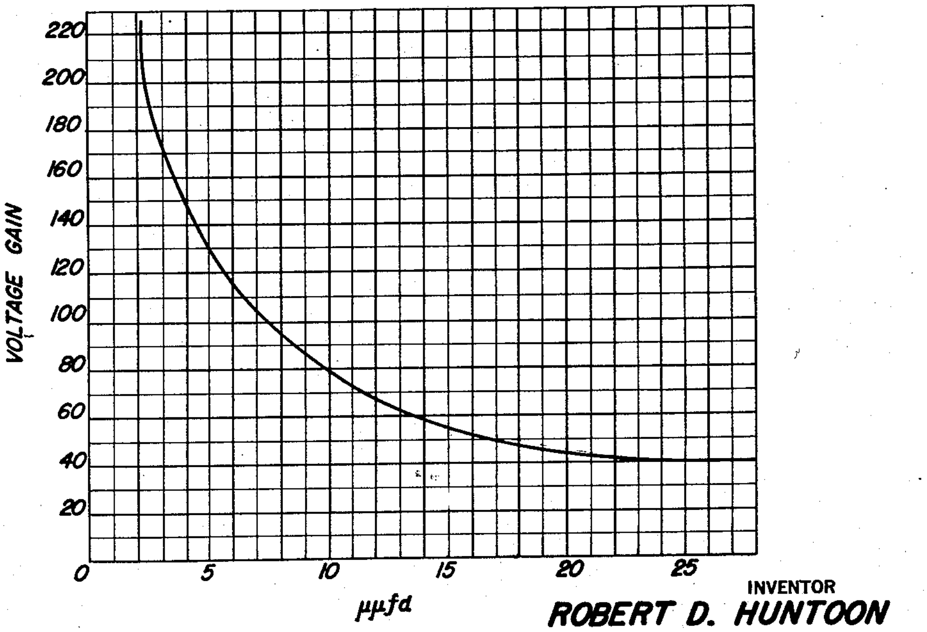
Fig. 4 is a curve showing the peak gain of the amplifier included in the Fig. 1 embodiment plotted against the capacity of the gain control capacitor provided in accordance with the present invention.

The marked effect of variation of the degenerative feedback in opposition to the normal regenerative feedback is clearly illustrated in Fig. 4, which indicates the wide range of gain control obtainable with a very small condenser having a value on the order of 10 micromicrofarads.

Figure 3:
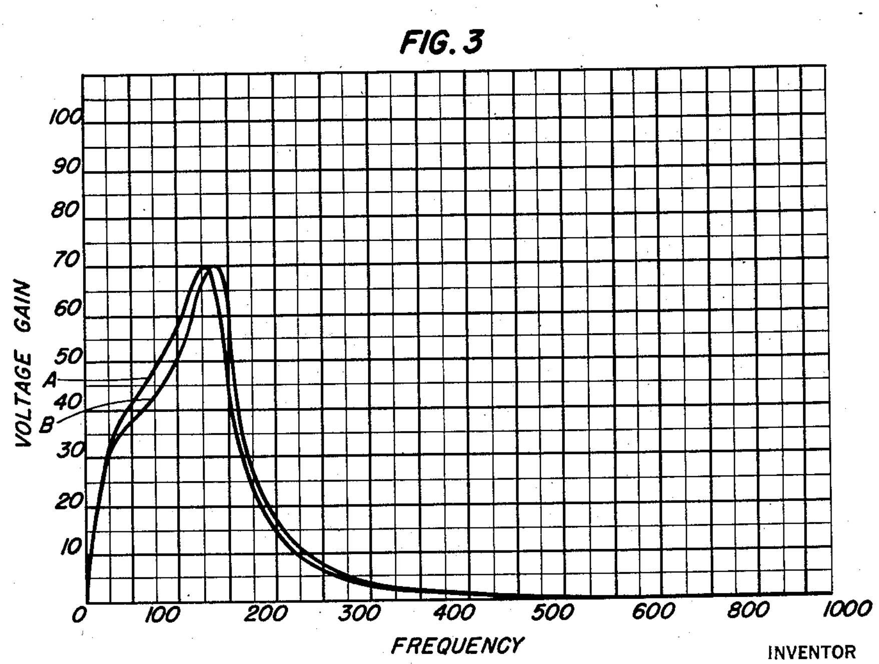
Fig. 3 is a graph comprising two frequency curves, one for an amplifier with a high gain tube and the other for an amplifier with a low gain tube, each amplifier having been adjusted by means of a gain control in accordance with the invention to have substantially the same peak gain, an alternating current filament supply being employed.

The curves of Fig. 3 show that by the use of the control capacitor 37 the amplified output signal applied to the thyratron grid may be made independent of wide variations of the gain characteristic or "mu" of the amplifier tubes. Curve A shows the variation of gain with frequency of an amplifier having a high gain tube and curve B shows the corresponding relation for an amplifier having a low gain tube. It will be noted that the peak responses of the amplifiers occur at substantially the same frequency. Alternating current was employed for filament supply in obtaining the data for these curves.

While there has been shown and described what is at present considered to be the preferred embodiment of this invention, it will be obvious to those skilled in the art that various changes and variations may be made therein without departing from the invention, and it is, therefore, aimed in the appended claim to cover all such changes and modifications as fall within the true spirit and scope of the invention.

The invention herein described may be manufactured and used by or for the Government of the United States of American for governmental purposes without the payment of any royalties thereon or therefor.

I claim:

An electronic amplifier comprising a first electron tube having an anode, a filamentary cathode and control electrode, an input circuit for said tube connecting said control electrode and a first side of said filamentary cathode, an output circuit for said tube connecting said anode and said first side of said filamentary cathode, a control electrode for a second electron tube, a series capacitance-resistance connecting said control electrode for said second tube to the anode of said first tube whereby to form a coupling network connecting the output circuit of said first tube to the input circuit of said control electrode of said second tube, a phase-shifting attenuating network comprising a plurality of series capacitors and shunting resistors connected intermediate said series capacitors for providing a frequency gain control, means connecting one end of said series capacitors to said control electrode and the other end of said series capacitors to the anode of said first tube and said shunting resistances to the other side of said filamentary cathode, a variable reactance element connected between said control electrode of the first electron tube and the junction of said series capacitance and resistance for providing an adjustable feedback path from the output of said coupling network to the input circuit of said first electron tube whereby the gain of said amplifier may be altered without material alteration in the frequency selectivity of said amplifier.

References Cited in the file of this patent

UNITED STATES PATENTS

| | | |
|---|---|---|
| 2,173,426 | Scott | Sept. 19, 1939 |
| 2,178,072 | Fritzinger | Oct. 31, 1939 |
| 2,189,849 | Wheeler | Feb. 13, 1940 |
| 2,237,407 | Bruck | Apr. 8, 1941 |
| 2,272,235 | Boucke | Feb. 10, 1942 |
| 2,315,043 | Boucke | Mar. 30, 1943 |
| 2,359,504 | Baldwin | Oct. 3, 1944 |